United States Patent
Grasset et al.

(10) Patent No.: US 6,594,474 B1
(45) Date of Patent: Jul. 15, 2003

(54) CONTROLLED-GAIN POWER AMPLIFIER DEVICE, IN PARTICULAR FOR RADIO-FREQUENCY CIRCUITS APPLIED TO CELLULAR MOBILE TELEPHONY

(75) Inventors: Jean-Charles Grasset, Moirans (FR); Christophe Pinatel, Le Fontanil (FR)

(73) Assignee: STMicroelectronics SA, Montrouge (FR)

( * ) Notice: Subject to any disclaimer, the term of this patent is extended or adjusted under 35 U.S.C. 154(b) by 461 days.

(21) Appl. No.: 09/650,003

(22) Filed: Aug. 28, 2000

(30) Foreign Application Priority Data

Sep. 3, 1999 (FR) .............................. 99 11088

(51) Int. Cl.[7] .......................... H03G 3/30; H03H 11/02
(52) U.S. Cl. ........................ 455/127; 455/550; 330/27
(58) Field of Search ................................ 455/127, 561, 455/522; 330/254, 279, 252, 289, 257; 327/359, 65, 66, 90

(56) References Cited

U.S. PATENT DOCUMENTS

| 4,146,844 | A | * | 3/1979 | Quinn | 330/149 |
|---|---|---|---|---|---|
| 4,451,798 | A | | 5/1984 | Yokoyama | 330/254 |
| 4,523,155 | A | * | 6/1985 | Walczak et al. | 330/279 |
| 4,992,753 | A | * | 2/1991 | Jenson et al. | 330/129 |
| 5,256,983 | A | * | 10/1993 | Nishiyama | 330/254 |
| 5,337,020 | A | * | 8/1994 | Daughtry et al. | 330/279 |
| 5,587,689 | A | * | 12/1996 | Bowers | 330/254 |
| 5,764,107 | A | * | 6/1998 | Stone | 330/279 |

FOREIGN PATENT DOCUMENTS

| EP | 0350155 | 1/1990 | ............. H03G/3/00 |
|---|---|---|---|
| EP | 0696847 | 2/1996 | ............ H03H/11/02 |

* cited by examiner

*Primary Examiner*—Vivian Chin
*Assistant Examiner*—Kamran Afshar
(74) *Attorney, Agent, or Firm*—Lisa K. Jorgenson; Allen, Dyer, Doppelt, Milbrath & Gilchrist, P.A.

(57) ABSTRACT

A power amplifier includes an input terminal, and a gain control circuit connected to the input terminal. The gain control circuit includes a circuit for providing a control signal, and at least a first pair of transistors. Each transistor includes a control terminal, a first conduction terminal and a second conduction terminal. The control terminals are connected together for receiving the control signal for control thereof. The first conduction terminals are connected together and to the input terminal. The at least one first pair of transistors defines a voltage/current transconductor circuit for converting an input voltage into an input current, and defines a shunt circuit for shunting at least a portion of the input current.

39 Claims, 3 Drawing Sheets

CONTROLLED-GAIN POWER AMPLIFIER DEVICE, IN PARTICULAR FOR RADIO-FREQUENCY CIRCUITS APPLIED TO CELLULAR MOBILE TELEPHONY

FIELD OF THE INVENTION

The present invention relates to electronics, and, more particularly, to a controlled-gain power amplifier device which is also known as a controlled-gain power driver. The present invention applies advantageously, but is not limited to radio-frequency circuits, particularly circuits used in cellular mobile telephones.

BACKGROUND OF THE INVENTION

Radio-frequency circuits used in cellular mobile telephones do not incorporate the power amplifier. The power amplifier is generally an external circuit formed using gallium arsenide (GaAs) technology. On the transmission side, the last stage incorporated into the radio-frequency circuit is a power amplifier device. The power amplifier device has a controlled gain, and is also known as a power driver. A power driver typically delivers a maximum level of only a few dBm (0 to 6 dBm) at 1 or 2 GHz depending on the frequency band. The power level delivered by the specific power amplification circuit that is formed within the radio-frequency circuits provides about 27 to 33 dBm. The power amplification circuit is formed from gallium arsenide, for example.

Moreover, for new generation telephones using the Code Division Multiple Access (CDMA) mode which includes embedding several tens of communications within the same frequency band (e.g., 1.25 MHz), the power amplification end stage must be furnished with variable-gain control whose dynamic range may reach 20 dB. It is necessary to control the power transmitted in view of a particular average power level requirement in transmissions using the CDMA mode.

Finally, the power driver must exhibit linearity constraints, i.e., a linearity of the transfer function linking the output power to the level of the input signal. Stated otherwise, if the input signal level increases linearly, the power output must also increase linearly. The requirements for this last stage of the radio-frequency circuit depend on a compromise between current consumption, linearity, supply voltage, circuit area (influencing the cost of the silicon), and noise floor.

Such a device or controlled-gain power amplifier stage receives a signal, which usually originates from an external filter whose output impedance requires a 50 ohm matching for template compliance constraints. One therefore generally finds in series from the input to the output of a power amplifier device an input impedance matching network, a voltage/current transconductor block, gain control carried out by shunting a variable proportion of the current from the transconductor block to the output load, and a network for matching power to the input of the specific power amplification circuit (which follows the integrated radio-frequency circuit).

The design most frequently encountered uses an input transconductor block which is a common emitter transistor (single-input version) or two transistors with linked common emitters (differential-input version). These are known for their high power gain. After the input transconductor block is a pair of transistors with linked emitters, which shunt part of the current originating from the transconductor block. The transistors of the transconductor block may be conventionally biased by a decoupled current source.

In this type of structure, the linked emitters of the transistors of the current shunting means or circuit are linked to the collector of the transistors of the transconductor block, and are consequently current-driven. Moreover, the input of the device is linked to the bases of the transistors of the transconductor block. Finally, the input matching of this type of stage involves using an inductance connected between the emitters of the transistors of the transconductor block and ground (differential-input version) to form an impedance having a real part with respect to the input.

This type of controlled-gain power amplification stage exhibits numerous drawbacks and limitations. First, the greater the linearity requirement, the greater the consumption of the stage. Moreover, such a prior art structure leads to a limitation in the maximum power output. This is because the limitation in the maximum voltage swing can be applied to the output without saturating the output transistor, i.e., the transistors of the current shunting circuit.

Also, the conventional bias circuits merely intensify the above limitation by adding the breakdown voltage of the transistor forming the bias current source. Furthermore, whereas the use of an inductance connected between the emitter of the input transistor and ground (single-input version) makes it possible to form an input impedance whose real part is significant, the natural input impedance of a bipolar transistor degenerated by such an inductance depends on numerous parameters.

Hence, the input matching network reflects towards the input of the arrangement the drifting of the nominal input impedance of the transconductor block related to the process and temperature variations. This often leads to unstable optimizations which may impair the efficiency of production. It may also result in different characteristics of the various batches produced.

Moreover, the order of magnitude of the natural input impedance of a common emitter arrangement is greater than 200 ohms. A 50 ohm matching therefore causes, on crossing the input impedance matching network, an over voltage whose coefficient is in the ratio of the square root of the impedances. The matching is frequently rendered impossible if this coefficient is too large. The matching is then done by degrading its quality coefficient, i.e., by introducing losses which degrade the noise factor.

Moreover, the search for high linearity is frustrated by the fact that the rise in the degeneracy inductance results in an increase in the input impedance of the transconductor block, and hence in the voltage at the input of the device. This goes against the sought-after effect since the input transconductor is voltage-controlled. Furthermore, the use of a degeneracy inductance across the terminals of the transistors of the transconductor block is expensive in terms of silicon area.

SUMMARY OF THE INVENTION

In view of the foregoing background, it is therefore an object of the present invention to provide a controlled-gain power amplifier device offering a better linearity/current consumption compromise, as well as better control of the input impedance of the device. This is applicable to a single input structure and a differential input structure.

Another object of the present invention is to provide a saving in terms of silicon area relative to the prior art devices.

Yet another object of the present invention is to provide a stable input matching that is easy to achieve.

A further object of the present invention is also to provide an arrangement allowing separate optimization of gain, noise and linearity.

Yet a further object of the present invention is to provide a biasing that allows accurate control of the quiescent currents, and which is not sensitive to the offset voltage of the biased transistors at high current, and is not sensitive to differences of the coefficients β of these transistors. There are different values for the coefficients β of the transistors formed in the silicon, although in theory they are identical.

These and other objects, advantages, and features in accordance with the present invention are provided by a controlled-gain power amplifier device comprising voltage/current transconductor means or a voltage/current transconductor circuit, and gain control means or a gain control circuit comprising shunting means or a shunting circuit able to shunt to the output of the device, in response to a control signal, all or some of the current delivered by the transconductor circuit. A control circuit delivers the control signal.

According to a general characteristic of the invention, the device comprises at least one pair of transistors having linked emitters (bipolar transistors) or sources (field effect transistors), controlled at their base or gate by the control circuit. This pair of transistors make up both the transconductor circuit and the shunting circuit. The emitters or sources of the transistors of the pair are furthermore connected to the input of the device.

Stated otherwise, the pair of transistors with linked emitters or sources (a single-input architecture) or else the two pairs of transistors with linked emitters or sources (a differential architecture with differential input) form a single active stage ensuring both the transconductance function and the current shunting function. In contrast, these two functions in the prior art devices were carried out by different circuits.

Furthermore, these pairs of transistors are now power-driven rather than current-driven. When power driven, these transistors see an impedance equal to their own input impedance while. When current driven (prior art), the transistors of the transconductor block see an impedance which was much higher than their own input impedance. The linearity/consumption compromise is significantly improved since the device comprises only a single active stage instead of, as in the prior art, two cascaded active stages.

Moreover, the input impedance of the active stage depends essentially on the emitter resistance and possesses a negligible imaginary part, thereby rendering the input matching easy and stable. Furthermore, this input impedance is small compared with the 50 ohm input matching generally required. This leads to the obtaining of an over voltage coefficient of less than 1, thus aiding the linearity of the device. The small ratio between the input impedance of the active stage and the 50 ohm impedance allows the device to operate even more in a small signal domain, thereby promoting linearity. Lastly, the absence of degeneracy inductance allows a very substantial reduction in the surface expanse of the device.

According to one embodiment of the invention, the device may comprise a feedback resistor connected between the emitters or sources of the transistors of the pair and the input of the device. The use of such a feedback resistor, which results in the addition of a further parameter, allows separate optimization of gain, noise and linearity.

Furthermore, this feedback resistor ensures extra linearity. However, it also leads to a decrease in the gain of the device. Hence, it is preferable, for certain applications, for the feedback resistance to be between 0.5 times and 3 times the emitter resistance or source resistance of the transistors of the pair. This leads to a good linearity/gain compromise.

According to an advantageous embodiment of the invention, the device comprises a biasing circuit for biasing the transistors of the pair. The biasing circuit comprises a bias resistor connected between the emitters or sources of the transistors of the pair and ground, as well as auxiliary circuit to slave the common mode voltage across the terminals of the bias resistor to a reference value. This is done through an amplifier controlling the common mode voltage.

Such an embodiment makes it possible to bias the transistors under a minimum breakdown voltage by a feedback amplifier which controls the common mode current of the structure (low frequency loop). A peak output swing equal to 60% of the supply voltage is then possible with a supply voltage on the order of 2.7 volts and a breakdown voltage of 200 mV. This leads to other applications at higher output power, but also to applications for which the supply voltage is even lower than 2.7 volts.

It is also particularly advantageous to provide a resistor or an additional inductance connected between the emitters or sources of the transistors of the pair and the bias resistor. Such an additional load makes it possible to increase the radio-frequency impedance of the biasing circuit. This thereby makes it possible to minimize the radio-frequency signal losses in the biasing circuit.

The subject of the invention is also applicable to a cellular mobile telephone comprising a controlled-gain power amplifier device as defined above.

BRIEF DESCRIPTION OF THE DRAWINGS

Other advantages and characteristics of the invention will become apparent on examining non-limiting embodiments, and the appended drawings, in which.

DETAILED DESCRIPTION OF THE PREFERRED EMBODIMENTS

Figure 1:
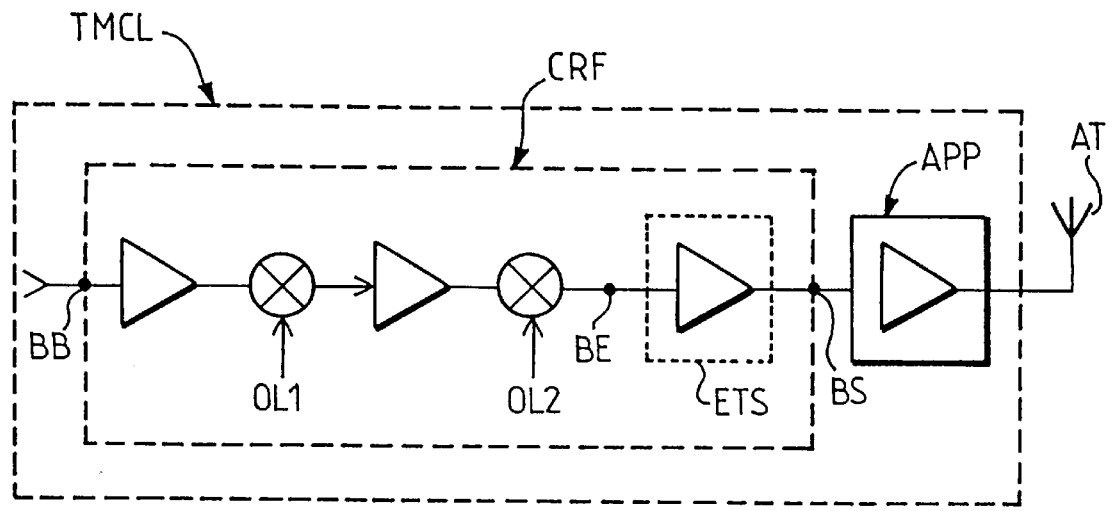
FIG. 1 is a block diagram of a radio-frequency circuit comprising at the output stage a controlled-gain power amplifier device according to the present invention.

In FIG. 1, the reference CRF designates a radio-frequency circuit preceding a power amplifier circuit APP. The circuit is formed using gallium arsenide technology, for example, and is connected to a transmission antenna AT. The assembly may be incorporated into a cellular mobile telephone TMCL, for example.

In FIG. 1, the other conventional elements of a cellular mobile telephone have not been represented to simplify the drawing. The radio-frequency circuit CRF receives a baseband signal on its input terminal BB and delivers on its output terminal BS a radio-frequency signal at 1 or 2 GHz, for example, with a maximum level of a few dBm. The power level at the output of the circuit APP can be on the order of 33 dBm.

The radio-frequency circuit conventionally comprises one or more frequency transposition stages or mixers (two are represented in FIG. 1) using local oscillator signals OL1 and OL2 to perform the frequency transposition. The last stage of the circuit CRF is a controlled-gain power amplification stage or device ETS. This is the subject of the present invention.

Figure 2:
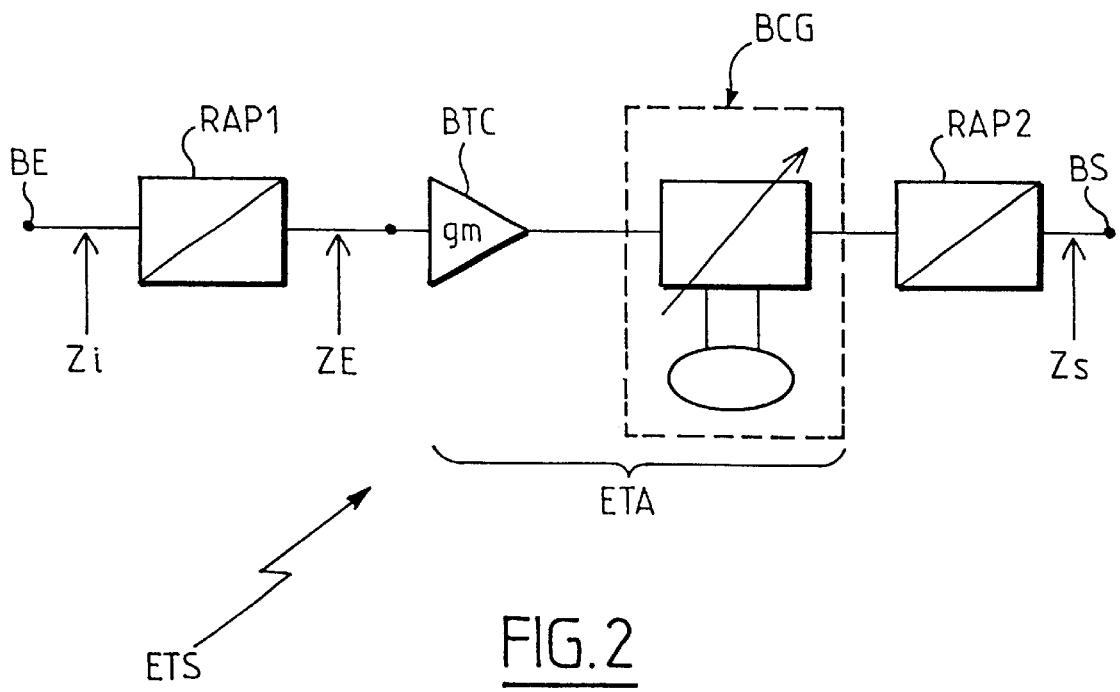
FIG. 2 is a more detailed block diagram of the controlled-gain power amplification device illustrated in FIG. 1.

As illustrated in FIG. 2, the controlled-gain power amplification device ETS comprises, between its input terminal BE and its output terminal BS, an input impedance matching network RAP1 followed by a voltage/current transconductor block BTC having a transconductance equal to gm. Next there is a gain control circuit BCG formed by shunting a variable proportion of the current from the transconductor block BTC to the output. Finally, there is an output impedance matching network RAP2.

Conventionally, the function of the input impedance matching network RAP1 is to present at the input terminal BE a prescribed input impedance Zi such as 50 ohms, whereas the input impedance ZE of the arrangement as seen downstream of the matching network RAP1 is different. Likewise, the purpose of the output impedance matching network RAP2 is to present at the output terminal BS a predetermined impedance Zs, such as 50 ohms.

Functionally, the transconductor block BTC converts a voltage present at its input into a current equal to the product of this voltage times the transconductance gm. The block BCG delivers to the matching network RAP2 all or a fraction of this current. This amount may be between 1/1000 and 1, for example.

Figure 3:
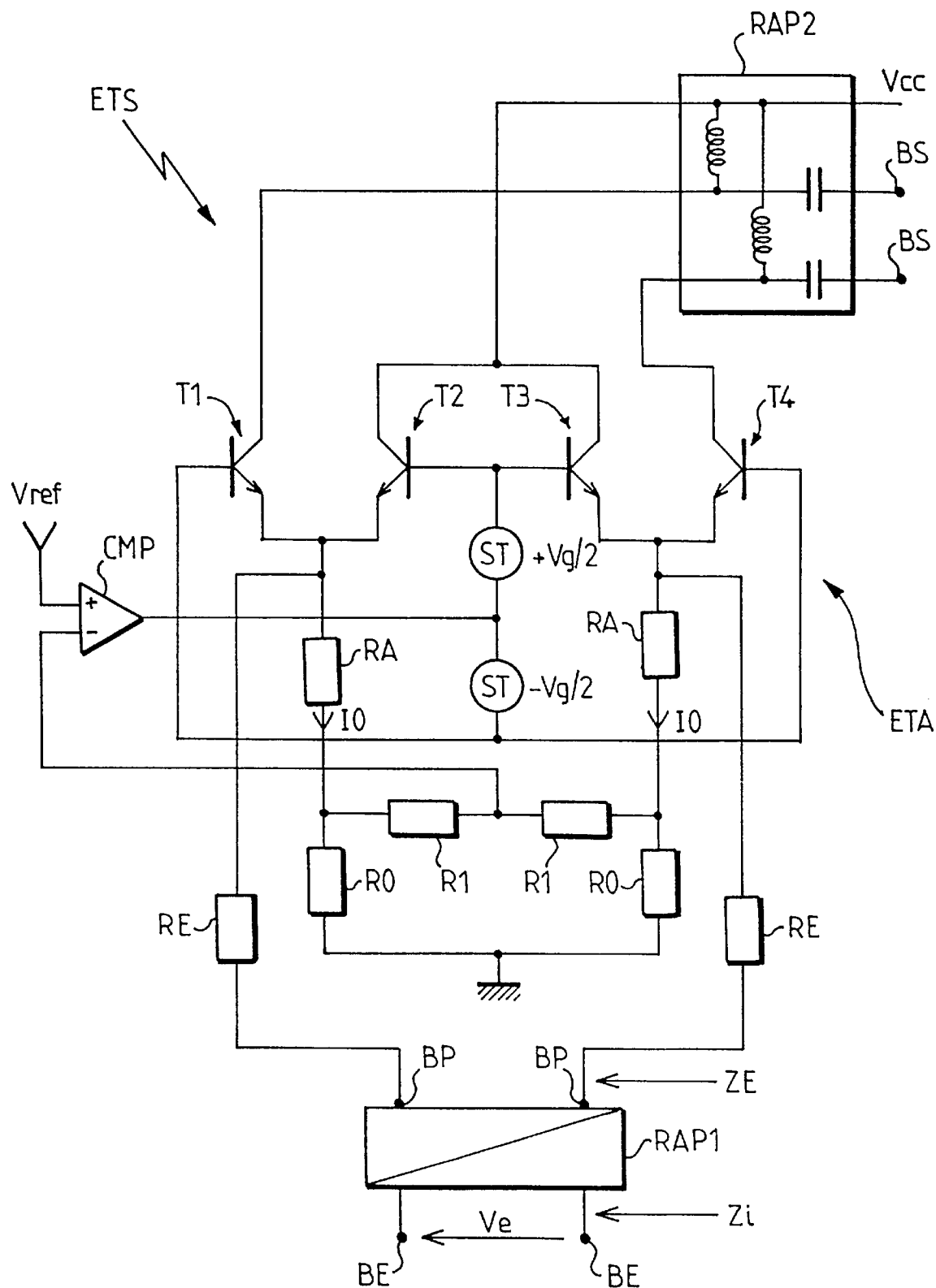
FIG. 3 is a schematic diagram of the controlled-gain power amplification device with a differential input structure according to the present invention.

According to the invention, the functions of transconductance BTC and of the current shunting will be carried out within the same active stage ETA, a structural example of which will be detailed while referring more particularly to FIG. 3. In this figure, which illustrates a structure of the differential type, the differential input BE is composed of two separate terminals. The same holds for the differential output BS. The active stage ETA is composed of two pairs of NPN bipolar transistors referenced T1, T2 and T3, T4.

The two inputs of the stage ETA are made up of the two linked emitters of the two transistors of each pair. The bases of the two transistors of each pair are linked together by two voltage sources ST equal to Vg/2 and −Vg/2 respectively. Moreover, the two collectors of the transistors T2 and T3 belonging to each of the two pairs are linked respectively to the supply voltage Vcc. The two collectors of the other two transistors T1 and T4 are linked respectively to the two output terminals BS via the output matching network RAP2.

The linked emitters of the transistors T1 and T2 of the first pair and the linked emitters of the transistors T3 and T4 of the second pair are connected respectively to the two input terminals BE by way of two feedback resistors RE and of the input matching network RAP1.

The current delivered at the output of the active stage ETA is equal to the product of the transconductance gm of this stage times the voltage Vin present downstream of the impedance matching network RAP1, i.e., between the terminals BP. Moreover, this voltage Vin is equal to the product of the over voltage coefficient Qv times the voltage Ve present upstream of the network RAP1, i.e., between the two input terminals BE. The over voltage coefficient Qv is equal to the square root of the ratio ZE/Zi. Moreover, in their current shunting function, the transistors T1, T2, T3 and T4 are controlled by control circuit made up of the voltage sources ST.

More precisely, the difference between the collector current of the transistor T1, for example, and the collector current of the transistors T2 and T3, is proportional to the emitter current $I_0$, and depends moreover on the control voltage Vg. Also, depending on the value of the control voltage Vg, the collector current of the transistors T2 and T3 may be higher or lower. Consequently, all or some of the current delivered by the stage ETA may actually be delivered at the output of the device, i.e., the terminals BS.

In the absence of feedback resistance RE, the impedance ZE is substantially equal to an emitter resistance 2re0 equivalent to the sum, i.e., of the two parallel emitter resistances of the transistors T1 and T2, or the two parallel emitter resistances of the transistors T3 and T4. Therefore, the transconductance gain of the active stage ETA is equal to gm0, where gm0 is proportional to 1/re0 and depends only on the bias current of these transistors.

Apart from the advantage achieved by the presence of a single active stage ETA instead of two cascaded stages in the prior art device, the input impedance ZE is real (zero imaginary part) and perfectly controlled, thus allowing easy and stable input matching. Furthermore, better intrinsic behavior of the drive by the emitter is obtained in view of the very good control of the input impedance and of the small voltage excursion on the emitter since, in the present case, the overvoltage coefficient Qv is less than 1. The conventional values of emitter resistances are on the order of 1 to 3 ohms, while Zi is equal to 50 ohms, for example.

The presence of the feedback resistor RE makes it possible to add a parameter which permits separate optimization of the gain, noise, and linearity. Thus, with the presence of the resistor RE, the impedance ZE is substantially equal to 2(RE+re0) and the transconductance gm of the stage ETA is then equal to gm0/(1+gm0*RE).

A feedback resistance RE between 0.5 times the emitter resistance re0 and three times this emitter resistance ensures a good compromise between the decrease in gain and the increase in linearity. A feedback resistance equal to twice the emitter resistance re0 may be chosen.

Although it would be possible to bias the transistors T1 to T4 with conventional biasing circuits, it is preferable to obtain a low breakdown voltage of the arrangement using the biasing circuit described in FIG. 3. More precisely, these comprise two bias resistors R0, respectively connected between ground and the emitters of the transistors T1 and T2, or T3 and T4.

The biasing circuit also comprises an auxiliary circuit comprising a linear amplifier CMP whose output is linked to the bases of the transistors T1 to T4 via the two voltage sources ST. The +input of the amplifier receives a reference voltage Vref, and the inverting input of the amplifier is connected to the midpoint of a resistive bridge R1. R1 is disposed between the bias resistors R1.

The common mode voltage across the terminals of the bias resistors R0 is thus slaved to the value Vref through the amplifier CMP controlling this common mode voltage of the transistors T1 to T4. The bias current I0 when quiescent (i.e., in the absence of any signal at the input) is then constant, predetermined, and is equal to Vref/R0.

Therefore, taking a voltage Vref equal to 200 mV and a resistance R0 equal to 10 ohms, a current I0 of 20 mA and a voltage across the terminals of the resistors R0 equal to 200 mV are obtained. A low breakdown voltage of the arrangement is therefore obtained. The voltage is reduced to VBE +VO, where VBE designates the base-emitter voltage drop of a bipolar transistor. Thus, under a supply Vcc of 2.7 volts, with VO equal to 200 mV, it is possible to obtain a peak output swing of 60% of the value of Vcc.

It is also advantageous to incorporate two additional resistors RA of 10 ohms, for example, between the two resistors R0 and the emitters of the transistors T1 and T2 or T3 and T4. These additional resistors make it possible to increase the radio-frequency impedance of the biasing circuit, and they thus minimize the radio-frequency signal loss in these biasing circuits.

Figure 4:
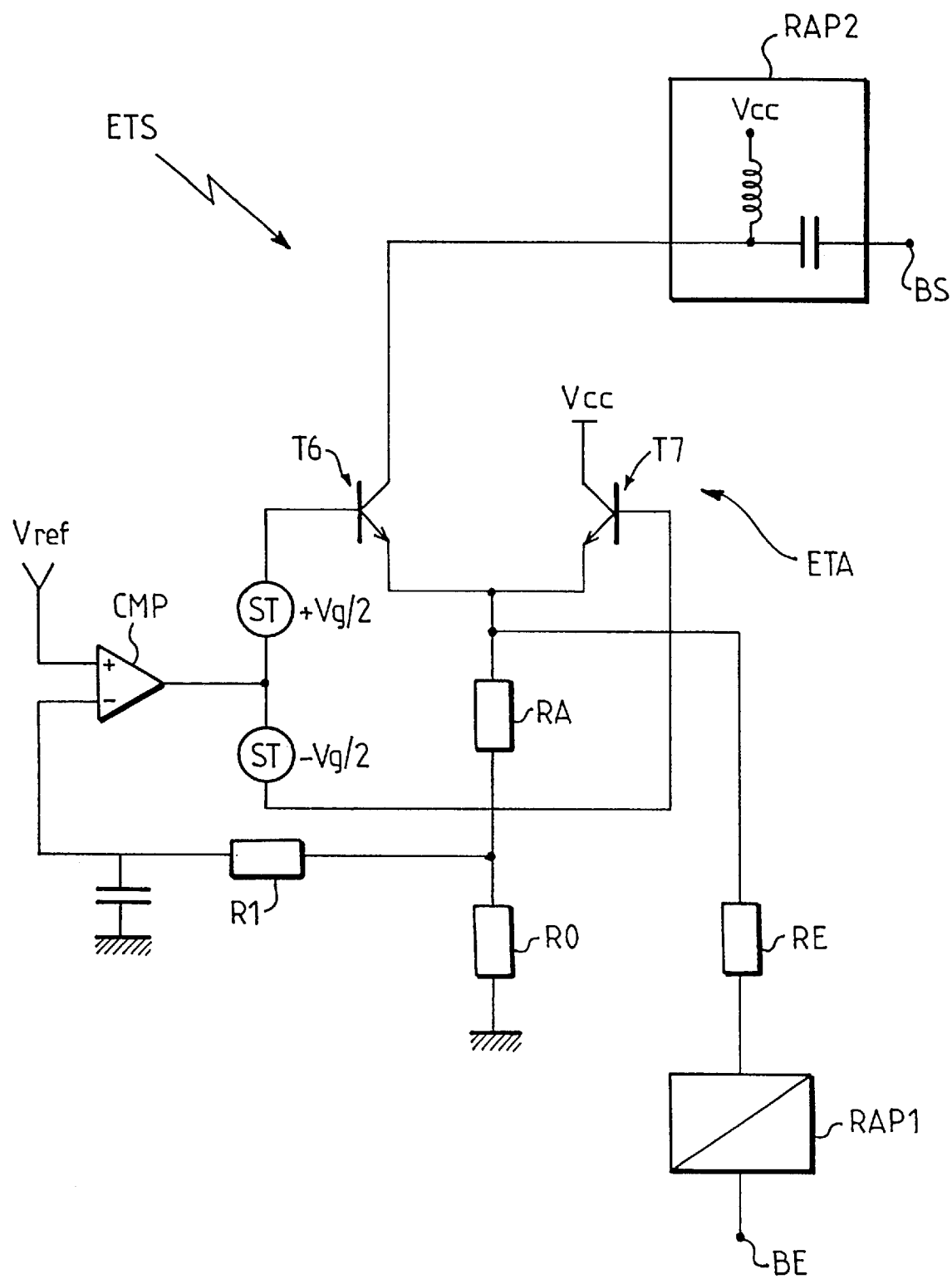
FIG. 4 is a schematic diagram of the controlled-gain power amplification device with a single input structure according to the present invention.

The example just described uses a differential structure. However, a structure with a single input, such as that illustrated in FIG. 4, is also possible. In this FIG. 4, elements which are similar or which have functions similar to those illustrated in FIG. 3 are assigned the same references. The manner of operation and the advantages of this embodiment will therefore not be described in detail here, as they are identical to those set forth in conjunction with FIG. 3.

In this single-input embodiment, the active stage ETA comprises only a single pair of transistors T6 and T7, the collector of one of the transistors (T6) is linked to the output terminal BS, whereas the collector of the other transistor (T7) is linked to the supply voltage +Vcc.

The invention has been described as using more particularly NPN bipolar transistors. The invention also applies to a device using transistors of opposite polarity via a reversal between the supply voltage and ground. The invention also applies to N-channel or P-channel MOS transistors. The source, the drain and the gate of these MOS transistors are functionally equivalent to the emitters, collectors and bases of the bipolar transistors.

Finally, in FIGS. 2 to 3 the input and output matching networks have been represented as forming an integral part of the devices according to the invention. This being so, these matching networks may be entirely within or in part of the device.

That which is claimed is:

1. A power amplifier comprising:
   an input terminal and an output terminal; and
   a gain control circuit connected to the input terminal, said gain control circuit comprising
      a circuit for providing a control signal, and
      a pair of transistors, each transistor comprising a control terminal, a first conduction terminal and a second conduction terminal, the control terminals being connected together for receiving the control signal, the first conduction terminals being connected together and to the input terminal,
      said first pair of transistors defining a voltage/current circuit for converting an input voltage into a current and defining a shunt circuit for shunting at least a portion of the current to the output terminal based upon the control signal.

2. A power amplifier according to claim 1, further comprising a feedback resistor connected between the first conduction terminals and the input terminal.

3. A power amplifier according to claim 2, wherein said feedback resistor has a resistive value between 0.5 and 3 times a resistive value of one of the first conduction terminals.

4. A power amplifier according claim 1, further comprising a biasing circuit for biasing said pair of transistors.

5. A power amplifier according claim 4, wherein said biasing circuit comprises:
   a bias resistor connected between the first conduction terminals and a first voltage reference; and
   an auxiliary circuit comprising an amplifier for controlling a common mode voltage across said bias resistor, said auxiliary circuit for slaving the common mode voltage across said bias resistor to a second voltage reference.

6. A power amplifier according to claim 5, further comprising a first resistor; and wherein said amplifier includes an output connected to the control terminals of said pair of transistors, a first input for receiving the second reference voltage, and a second input connected in series with said first resistor and said bias resistor.

7. A power amplifier according to claim 5, further comprising a second resistor connected between the first conduction terminals and said bias resistor.

8. A power amplifier according to claim 1, further comprising:
   an input impedance matching network connected between the input terminal and said gain control circuit; and
   an output impedance matching network connected between said gain control circuit and the output terminal.

9. A power amplifier comprising:
   an input terminal and an output terminal; and
   a gain control circuit connected to the input terminal, said gain control circuit comprising
      a circuit for providing a control signal, and
      a pair of transistors, each transistor comprising a control terminal, a first conduction terminal and a second conduction terminal, the control terminals being connected together for receiving the control signal, the first conduction terminals being connected together and to the input terminal,
      said first pair of transistors for converting an input voltage into a current and for shunting at least a portion of the current to the output terminal based upon the control signal.

10. A power amplifier according to claim 9, further comprising a feedback resistor connected between the first conduction terminals and the input terminal.

11. A power amplifier according to claim 10, wherein said feedback resistor has a resistive value between 0.5 and 3 times a resistive value of one of the first conduction terminals.

12. A power amplifier according claim 9, further comprising a biasing circuit for biasing said pair of transistors.

13. A power amplifier according claim 12, wherein said biasing circuit comprises:
   a bias resistor connected between the first conduction terminals and a first voltage reference; and
   an auxiliary circuit comprising an amplifier for controlling a common mode voltage across said bias resistor, said auxiliary circuit for slaving the common mode voltage across said bias resistor to a second voltage reference.

14. A power amplifier according to claim 13, further comprising a first resistor; and wherein said amplifier includes an output connected to the control terminals of said pair of transistors, a first input for receiving the second reference voltage, and a second input connected in series with said first resistor and said bias resistor.

15. A power amplifier according to claim 13, further comprising a second resistor connected between the first conduction terminals and said bias resistor.

16. A power amplifier according to claim 9, further comprising:
   an input impedance matching network connected between the input terminal and said gain control circuit; and
   an output impedance matching network connected between said gain control circuit and an output terminal.

17. A power amplifier comprising:
a differential input having a first input terminal and a second input terminal;
a differential output terminal; and
a gain control circuit connected to the differential input, said gain control circuit comprising
a circuit for providing a first control signal and a second control signal, and
a first pair of transistors and a second pair of transistors, each transistor comprising a control terminal, a first conduction terminal and a second conduction terminal, the first conduction terminals of said first pair of transistors being connected together and to the first input terminal, the first conduction terminals of said second pair of transistors being connected together and to the second input terminal, a first one of the control terminals from said first pair of transistors being connected to a first one of the control terminals of said second pair of transistors for receiving the first control signal, a second one of the control terminals from said first pair of transistors being connected to a second one of the control terminals of said second pair of transistors for receiving the second control signal,
said first and second pairs of transistors for converting input voltages applied to the first and go second input terminals into input currents and shunting at least a portion of the input currents to the differential output terminal based upon the first and second control signals.

18. A power amplifier according to claim 17, further comprising:
a first feedback resistor connected between the first conduction terminals of said first pair of transistors and the first input terminal; and
a second feedback resistor connected between the first conduction terminals of said second pair of transistors and the second input terminal.

19. A power amplifier according to claim 18, wherein said first feedback resistor has a resistive value between 0.5 and 3 times a resistive value of one of the first conduction terminals of said first pair of transistors, and said second feedback resistor has a resistive value between 0.5 and 3 times a resistive value of one of the first conduction terminals of said second pair of transistors.

20. A power amplifier according claim 17, further comprising a biasing circuit for biasing said first and second pairs of transistors.

21. A power amplifier according claim 20, wherein said biasing circuit comprises:
a first bias resistor connected between the first conduction terminals of said first pair of transistors and a first voltage reference;
a second bias resistor connected between the first conduction terminals of said second pair of transistors and the first voltage reference; and
an auxiliary circuit comprising an amplifier controlling a common mode voltage across said first and second bias resistors, said auxiliary circuit for slaving the common mode voltage across said first and second bias resistors to a second voltage reference.

22. A power amplifier according to claim 20, further comprising a pair of first resistors connected together between said first and second bias resistors; and wherein said amplifier includes an output connected to the control terminals of said first and second pairs of transistors, a first input for receiving the second reference voltage, and a second input connected to a common node between said pair of first resistors.

23. A power amplifier according to claim 20, further comprising a pair of second resistors, one of said second resistors being connected between the first conduction terminals of said first pair of transistors and said first bias resistor, and another one of said second resistors being connected between the first conduction terminals of said second pair of transistors and said second bias resistor.

24. A power amplifier according to claim 17, further comprising:
an input impedance matching network connected between the first and second input terminals and said gain control circuit; and
an output impedance matching network connected between said gain control circuit and the differential output terminal.

25. A cellular telephone comprising:
a radio frequency circuit having an input receiving a baseband signal and an output providing a radio frequency signal, said radio frequency circuit comprising
a power amplifier comprising
at least one input terminal for receiving the baseband signal,
at least one output terminal,
a gain control circuit connected to the at least one input terminal, said gain control circuit comprising
a circuit for providing at least one control signal, and
at least one first pair of transistors, each transistor comprising a control terminal, a first conduction terminal and a second conduction terminal, the control terminals being connected together for receiving the at least one control signal, the first conduction terminals being connected together and to the at least one input terminal,
said at least one first pair of transistors for converting the baseband signal into a current and for shunting at least a portion of the current to the at least one output terminal based upon the at least one control signal; and
an antenna connected to said radio frequency circuit for receiving the radio frequency signal.

26. A cellular telephone according to claim 25, further comprising at least one feedback resistor connected between the first conduction terminals and the at least one input terminal.

27. A cellular telephone according to claim 26, wherein said at least one feedback resistor has a resistive value between 0.5 and 3 times a resistive value of one of the first conduction terminals.

28. A cellular telephone according claim 25, further comprising a biasing circuit for biasing said at least one first pair of transistors.

29. A cellular telephone according claim 28, wherein said biasing circuit comprises:
at least one bias resistor connected between the first conduction terminals and a first voltage reference; and
an auxiliary circuit comprising an amplifier controlling a common mode voltage across said at least one bias resistor, said auxiliary circuit for slaving the common mode voltage across said at least one bias resistor to a second voltage reference.

30. A cellular telephone according to claim 29, further comprising at least one first resistor; and wherein said amplifier includes an output connected to the control terminals of said at least one first pair of transistors, a first input for receiving the second reference voltage, and a second input connected to said at least one first resistor.

31. A cellular telephone according to claim 29, further comprising at least one second resistor connected between the first conduction terminals and said at least one bias resistor.

32. A cellular telephone according to claim 25, further comprising:

an input impedance matching network connected between the at least one input terminal and said gain control circuit; and an output impedance matching network connected between said gain control circuit and at least one output terminal.

33. A method for controlling a gain of a power amplifier comprising an input terminal and an output terminal, and a gain control circuit connected to the input terminal, the gain control circuit comprising a circuit for providing a control signal, and a pair of transistors, each transistor comprising a control terminal, a first conduction terminal and a second conduction terminal, the control terminals being connected together for receiving the control signal, the first conduction terminals being connected together and to the input terminal, the method comprising:

converting an input voltage into a current using the pair of transistors; and shunting at least a portion of the current to the output terminal based upon the control signal using the pair of transistors.

34. A method according to claim 33, further comprising forming a feedback loop comprising a feedback resistor connected between the first conduction terminals and the input.

35. A method according to claim 34, wherein the feedback resistor has a resistive value between 0.5 and 3 times a resistive value of one of the first conduction terminals.

36. A method according claim 33, further comprising biasing the pair of transistors using a biasing circuit.

37. A method according claim 36, wherein biasing comprises:

connecting a bias resistor between the first conduction terminals and a first voltage reference; and controlling a common mode voltage across the bias resistor using an auxiliary circuit comprising an amplifier, the auxiliary circuit for slaving the common mode voltage across the bias resistor to a second voltage reference.

38. A method according to claim 37, further comprising a first resistor; and wherein the amplifier includes an output connected to the control terminals of the pair of transistors, a first input of the amplifier for receiving the second voltage reference, and a second input of the amplifier being connected to the first resistor and the bias resistor.

39. A method amplifier according to claim 37, further comprising connecting a second resistor between the first conduction terminals and the bias resistor.

* * * * *